United States Patent [19]

Bohning

[11] Patent Number: 4,816,762

[45] Date of Patent: Mar. 28, 1989

[54] THREE-DIMENSIONAL METRIC, PERFUSION AND METABOLIC COMPARTMENT SPECTROSCOPY PHANTOM

[75] Inventor: Daryl E. Bohning, Birmingham, Ala.

[73] Assignee: North American Philips Corporation, New York, N.Y.

[21] Appl. No.: 28,938

[22] Filed: May 11, 1987

Related U.S. Application Data

[63] Continuation-in-part of Ser. No. 7,145, Jan. 26, 1987.

[51] Int. Cl.⁴ .............................................. G01R 33/20
[52] U.S. Cl. ....................................... 324/300; 324/318
[58] Field of Search ............... 324/300, 307, 309, 312, 324/318, 321

[56] References Cited

U.S. PATENT DOCUMENTS

| | | | |
|---|---|---|---|
| 3,555,407 | 1/1971 | Bozanic et al. | 324/300 |
| 4,551,678 | 11/1985 | Morgan et al. | 324/321 |
| 4,613,819 | 9/1986 | Chui | 324/300 |
| 4,625,168 | 11/1986 | Meyer et al. | 324/318 |
| 4,644,276 | 2/1987 | Sierocuk et al. | 324/300 |

FOREIGN PATENT DOCUMENTS 59-15844 1/1984 Japan ........................ 324/300
59-157547 9/1984 Japan .

Primary Examiner—Stewart J. Levy
Assistant Examiner—Lawrence G. Foss
Attorney, Agent, or Firm—Thomas A. Briody; Jack E. Haken; Anne E. Barschall

[57] ABSTRACT

A method and apparatus for calibrating NMR imaging and imaging spectroscopy devices. A precise three-dimensional Cartesian grid allowing measurable three-dimensional fluid flow is established. $T_1/T_2$ and regional spectroscopy is precisely measured at diverse places in the grid. Gradual system change over time is measured by pumping fluids through the grid. A modular embodiment can be reassembled into different shapes by the user, and provides both flow-through and static fluid measurements.

42 Claims, 7 Drawing Sheets

Z=1,9

Z=2,8

Z=3,7

Z=4,6

Z=5

THREE-DIMENSIONAL METRIC, PERFUSION AND METABOLIC COMPARTMENT SPECTROSCOPY PHANTOM

This is a continuation-in-part of application Ser. No. 7,145, filed Jan. 26, 1987.

BACKGROUND OF THE INVENTION

1. Field of the Invention

The invention relates to a method and apparatus for calibrating NMR imaging and imaging spectroscopy devices. The apparatus establishes a precise three-dimensional grid. One embodiment allows three-dimensional, measurable fluid flow through the grid. A second embodiment is easily reassembled by the user.

2. Prior Art

The necessity of calibrating NMR imaging devices has long been recognized. Most such calibration is achieved by imaging a phantom. A phantom is a device of known characteristics which can be placed in the NMR imaging device and which produces a predictable image.

Previous phantoms have allowed for two-dimensional calibration, i.e. calibration in a single plane. However, in practice, the NMR imaging devices are used to image objects having three dimensions, such as the organs of the human body. Unlike CT imaging, which is only capable of collecting multiple two-dimensional slices, NMR is a true three-dimensional technique. For instance, double angulation can be done with NMR machines, or data can be collected from a volume and later reconstructed into slices at arbitrary angles.

Some three-dimensional or pseudo three-dimensional phantoms have been developed. For example, U.S. Pat. No. 4,625,168, issued to Meyer et al, shows a cylinder with grooves forming a grid. The grooves contain some material different from the cylinder and therefore produce a contrasting NMR image.

Nevertheless certain problems remain. One problem is the difficulty of machining solid phantoms. Known plexiglass phantoms, for instance, prove very expensive. Moreover, such phantoms are usually composed of stacks of two-dimensional structures rather than providing a true three-dimensional metric. They do not easily provide calibration for double angulation, because they do not provide similar grids in all three dimensions.

Another problem that remains is calibrating the spatial distributions of three-dimensional fluid flow and rate of fluid flow. NMR machines are particularly useful in medical applications, because they are able to distinguish many different fluids, and track the movement of those fluids through three-dimensional space. A number of new and evolving medical applications require measuring $T_1$ and $T_2$ relaxation times in moving fluids in three-dimensional space. Other applications in magnetic resonance spectroscopy (MRS) require taking spectra of static and moving fluids from various places in three-dimensional space, e.g. the confines of an organ of the body.

Yet another problem is that most phantoms are fixed. They do not allow the user to reshape them into useful alternative three-dimensional shapes.

One example of medical applications requiring calibration of three dimensional fluid flow is the study of the flow and perfusion of blood through the brain or heart.

An example of an application requiring accurate three-dimensional localization of a sample volume is measuring phosphorous 31 spectra at different locations in an organ. The relative concentration of phosphorous metabolites: ATP, phosphocreatine (PCR) and inorganic phosphate (Pi) define the energy state of cells. In addition, intracellular pH can be determined by the spatial chemical shift (altered position in the spectrum of the inorganic phosphate peak).

Another example of an application requiring both accurate localization and known flow is determining the effects of blood perfusion on spectroscopic saturation transfer measurements.

For these and other applications, being certain of the actual small localized volume within the body that was sampled is essential for the interpretation of results.

In the prior art, a rack of small bottles was commonly used to calibrate $T_1$, $T_2$ characteristics. The bottles typically contained solutions of paramagnetic ions, such as $Cu^{2+}$, $Cr^{3}3$, $Fe^{3+}$, $Mn^{2+}$, $Gd^{+}$, in concentrations ranging from $10^{-5}$ to $10^{-1}$ mol/liter. But this gives only a two-dimensional distribution. An example of phantoms made from bottles, containing U-shaped tubes for fluid flow, is found in P. R. Moran et al, "Verification of Internal Flow and Motion", Radiology 1985; 154: 433–441. This article also discusses the importance of fluid flow to NMR medical applications.

The Meyer patent also uses fluids having different values for $T_1$ and $T_2$ to calibrate sensitivity of an NMR device to these different values. However, the fluids in the Meyer patent are static.

Phantoms consisting of two or three coaxial or concentric chambers have been constructed giving three-dimensional or pseudo three-dimensional distributions, but these are difficult to build, provide limited dimensional information, and will not support flow studies.

Thus, at the present time calibration for many applications is impossible.

SUMMARY OF THE INVENTION

It is an object of the present invention to create a precise three-dimensional Cartesian grid for calibrating an NMR imaging device. The grid is to include materials selected to give minimal NMR signal so the cross-sections of the grid provide NMR grid images defined by contrasting light and dark areas. Preferably the grid gives images having dark lines overlaying a light background.

It is a further object of the invention to define at least one fluid path through the three-dimensional grid so that fluid flow may be measured at various places in the grid.

It is a still further object of the invention to define an integral network of communicating chambers which provide a plurality of fluid paths through the three-dimensional Cartesian grid, so that absolute and relative fluid flow may be measured at various places in the grid.

It is yet another object of the invention to create reusable modules which can be assembled into a variety of alternative shapes within a three dimensional Cartesian grid.

In one embodiment a plurality of precisely measured identical blocks are stacked in layers to form the three-dimensional grid. The blocks are made of a material giving minimal NMR signal and are preferably hollow to retain a fluid which provides a strong NMR signal. Holes may be made in the blocks to form communicating chambers which may be filled with fluid or, which may allow fluid to flow through the grid if connected to the outside surface of the phantom. Tubes may be added to guide the entry of fluid into and the exit of fluid from the phantom. A number of tubes and holes may be used to create a number of fluid pathways. The blocks may be hollow plastic toy blocks commonly sold under the Lego ® or Lego ® Duplo ® Trademark.

Methods for calibrating $T_1$ and $T_2$ images and for calibrating regional spectra are disclosed which provide simultaneous calibration of the three-dimensional distribution of data including dynamic change in that three dimensional distribution.

In another embodiment the blocks are built into modules, which may be sealed or flow through. The modules may be assembled into a variety of 3-D phantoms.

BRIEF DESCRIPTION OF THE DRAWINGS

Some preferred embodiments of the invention will be described in detail with reference to the following drawings.

DETAILED DESCRIPTION OF THE PREFERRED EMBODIMENT

Figure 5A:
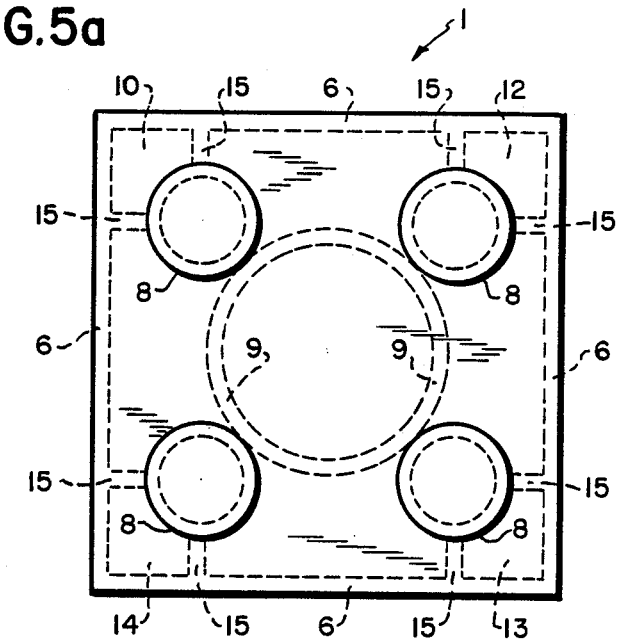
FIG. 5a is a top plan view of the preferred block.
Figure 5B:
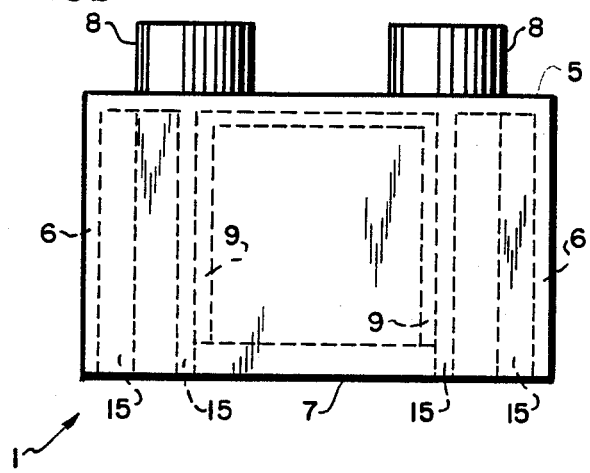
FIG. 5b is a side elevation view of the preferred block.

FIGS. 5a and 5b are views of a preferred block 1 in accordance with the invention (which may for example be a hollow plastic toy of the type commonly sold under the o trademark Lego ® or Lego ® Duplo ®.) FIGS. 5a and 5b are included to assist in the definition of terminology used hereinafter and to describe the preferred blocks. FIG. 5 is not to scale. The block 1 has a top 5, four walls 6, an open bottom 7, and protrusions 8 on the top 5. The block 1 also has a center cylinder 9 which protrudes inward from the top wall 5 about seven-eighths of the way to the bottom 7. The interior of the block is hollow, as is the interior of the center cylinder 9. The block has eight fins 15 protruding from the inner walls of the inside of the block. The top 5 of the block 1 has corners which will be referred to, for convenience, as Northwest 10 (NW), Northeast 12 (NE), Southwest 14 (SW), and Southeast 13 (SE). A protrusion 8 of one block may be inserted through the open bottom 7 of another block and wedged between two respective fins 15 and the center cylinder 9 of the other block so as to be held in place.

Different respective positions of stacked blocks may be achieved by inserting one, two, or four of the protrusions 8 of one block into the open bottom 7 of another block, wedging each protrusion 8 between two respective fins 15 and the center cylinder 9.

The preferred block is referred to as 2×2 because of the four protrusions, which are arranged in a square. The preferred block also has dimensions approximately 2.9 cm×2.9 cm×1.8 cm, the 1.8 cm referring to its measure from top to bottom excluding protrusions.

The above-mentioned terminology conventions have been chosen for convenience. The actual absolute orientation of the preferred blocks in space is not significant.

The preferred blocks were chosen because they are readily available in large quantities at relatively low prices. The available blocks are also substantially uniform. Their uniformity is required by their prior art application, i.e. stacking them into toy structures. The blocks preferably should be uniform to at least a precision of ±1/20 mm. Such blocks, when appropriately stacked, create a three-dimensional Cartesian grid which is precise to roughly the size of a human arteriole. This allows for calibration of angiographic studies, and is adequate for the accurate apportionment of adjacent volumes for studies of human blood perfusion. Smaller blocks, also readily commercially available, may be useful for studies of smaller volumes. Smaller blocks typically do not have fins, but rely on wedging protrusions between walls or between walls and center cylinders to hold stacked structures in position. Another advantage of the preferred blocks is the ease with which they can be assembled and reassembled into different shapes. Yet another advantage of the preferred blocks is that they are hollow, and can thus be easily filled with fluid. Their hollowness means that pathways can also be easily formed in the blocks by drilling holes in their tops 5. The holes, the walls 6, the fins 15, and the center cylinder 9 combine to create communicating chambers through a stacked structure. It will be readily apparent that other blocks and other structures may be used to provide a three dimensional Cartesian grid.

Figure 1:
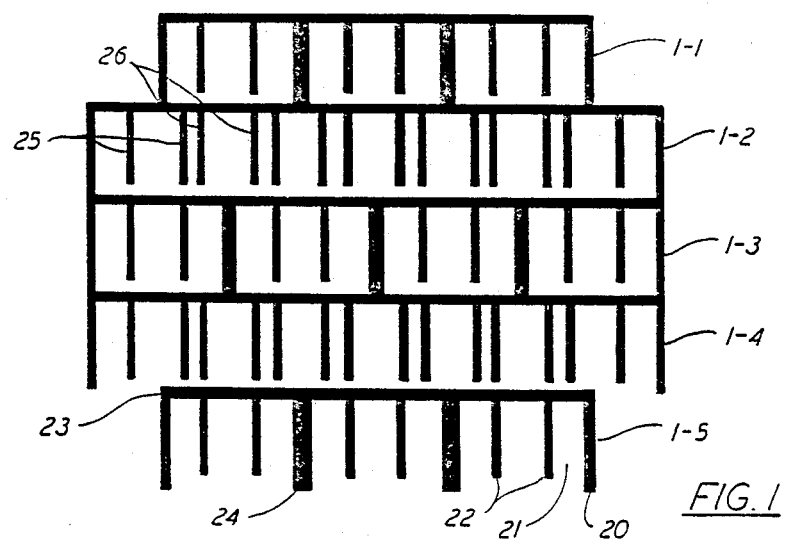
FIG. 1 is a schematic of a photograph of an NMR image of a small embodiment of the present invention comprising the preferred blocks immersed in a contrasting solution.

FIG. 1 is a schematic of an NMR image of a small embodiment of the present invention comprising the preferred blocks immersed in an NMR signal generating fluid. It will be seen that there are five layers of blocks in this figure numbered 1-1 through 1-5.

The blocks of layers 1-1, 1-3, and 1-5 are substantially as shown in FIG. 5. For instance, in layer 1-5, cross-sections of the following parts can be seen: walls 20, bottoms 21, cross-sections of the center cylinder 22 and tops 23. Where two walls are immediately adjacent 24, a thickened line is shown. This line is thickened to represent two adjacent walls, with substantially no signal producing fluid seeping between the two walls. Layers 1-1 and 1-5 have three of the preferred blocks. Layer 1-3 has four of the preferred blocks.

Both layers 1-2 and 1-4 consist of a single block which is longer than the preferred blocks. Both layers 1-2 and 1-4 have a plurality of consecutive center cylinders, for instance 25 and 26. It will be noticed that the longer blocks are less useful in calibrating distance, because of the lack of the thick vertical double walls 24 present at regular intervals in the layers of shorter blocks, as shown in FIG. 5. The use of the shorter 2×2 blocks is therefore preferred.

It is also preferred to use the walls, rather than the center cylinders or the fins of the blocks, to establish a Cartesian grid. The center cylinders and fins produce images which vary unacceptably with choice of cross-sectional plane.

In the preferred embodiment, the NMR signal producing fluid, which appears as blank in FIG. 1, and the blocks are sealed in a close-fitting container. Preferably the blocks are assembled under fluid to avoid any air bubbles in the phantom. Air gives little signal and therefore contrasts less favorably with the blocks than would the preferred fluids. After assembly, the blocks and the fluid are inserted in the sealed container. The most commonly used solution, aqueous copper sulfate, is relatively easy to work with in this manner.

The blocks used to produce FIG. 1 were stacked in a conventional manner i.e. by inserting the top protrusions of one block into the hollow bottom of another. The protrusions and fins cannot be seen on the particular cross-section chosen, because they lie in another plane. The protrusions are held in place by friction between the walls of the blocks and the center cylinders of the blocks. The blocks are thus held in sufficiently close proximity that no visible NMR signal producing fluid appears between the walls of adjacent blocks. The blocks are also sufficiently close together both horizontally and vertically that flow of the NMR signal producing fluid between blocks is substantially impaired. However, the gap between the center cylinder and the bottom of each block does allow fluid flow within each block. Any fluid flow between the blocks may be further impaired by the introduction of a sealant between the blocks, for example a silicone sealant.

Figure 2:
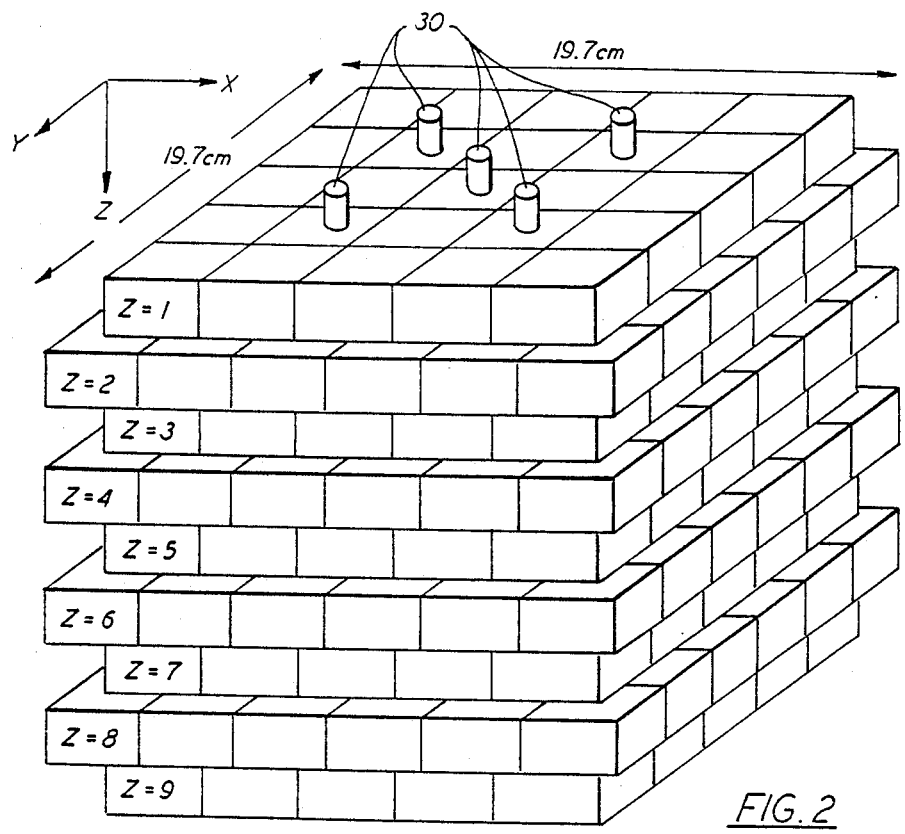
FIG. 2 is an isometric view of a human head size phantom in accordance with the invention.

FIG. 2 is an isometric view of a human head sized phantom according to the preferred embodiment. The preferred embodiment has nine layers of blocks, labeled $z=1$ through $z=9$. Layers $z=1$, $z=3$, $z=5$, $z=7$, and $z=9$ each have twenty-five blocks. The twenty-five blocks in each layer $z=1$, $z=3$, $z=5$, $z=7$, and $z=9$ are arranged in a five-by-five array, i.e. an array of five columns and five rows. Layers $z=2$, $z=4$, $z=6$, and $z=8$ each have thirty-six blocks. The thirty-six blocks in each layer $z=2$, $z=4$, $z=6$, and $z=8$ are arranged in a six-by-six array, i.e. an array of six columns and six rows.

A center block of each of the five-by-five layers is directly above the intersection of two center lines, between a third column and a fourth column and between a third row and a fourth row, of the six-by-six layers.

Five tubes 30 enter the top layer, $z=1$. These tubes allow entry or exit of fluid from the phantom. Similar tubes, not shown, are placed in the layer $z=9$. Fluid may be poured, injected, pumped or otherwise introduced into the tubes. Techniques for introducing fluids into such tubes are well-known in the art.

The preferred embodiment is preferably contained, along with an NMR signal producing fluid, in a liquid tight container (not shown) of dimensions preferably 19.7 cm × 19.7 cm × 9.7 cm.

Figure 3:
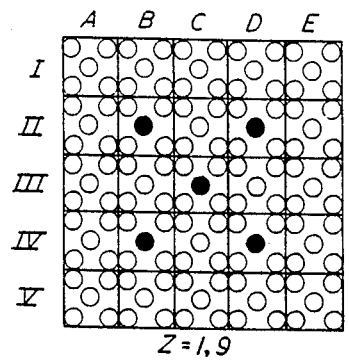
FIG. 3 shows hole patterns in the various layers of FIG. 2.
Figure 3:
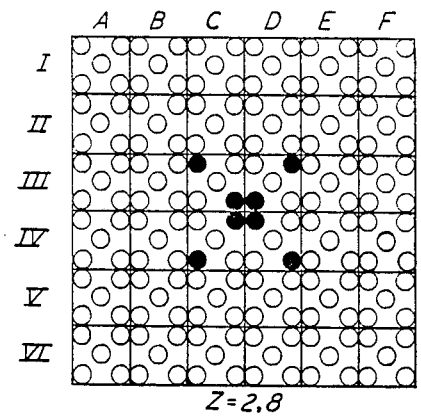
Figure 3:
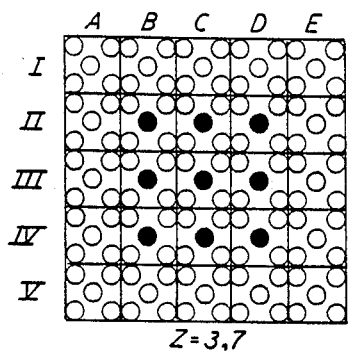
Figure 3:
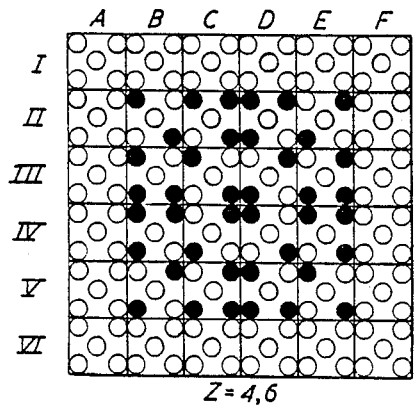
Figure 3:
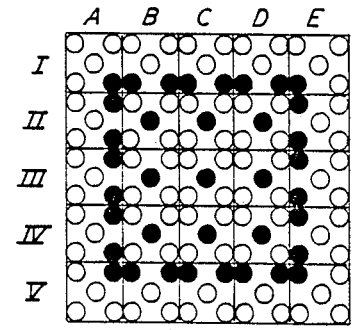

FIG. 3 shows drilling patterns in the various layers of the sample embodiment of FIG. 2. The dark circles in FIG. 3 represent actual holes. The light circles in FIG. 3 represent candidates for hole locations, where in fact no holes have been drilled. The placement of the holes is described in the following tables:

TABLE A
($Z = 1, Z = 9$)

| row | A | B | C | D | E |
|---|---|---|---|---|---|
| I | none | none | none | none | none |
| II | none | center | none | center | none |
| III | none | none | center | none | none |
| IV | none | center | none | center | none |
| V | none | none | none | none | none |

TABLE B
($Z = 3, Z = 7$)

| row | A | B | C | D | E |
|---|---|---|---|---|---|
| I | none | none | none | none | none |
| II | none | center | center | center | none |
| III | none | center | center | center | none |
| IV | none | center | center | center | none |
| V | none | none | none | none | none |

TABLE C
($Z = 5$)

| row | A | B | C | D | E |
|---|---|---|---|---|---|
| I | SE | SW,SE | SW,SE | SW,SE | SW |
| II | NE,SE | center | center | center | NW,SW |
| III | NE,SE | center | center | center | NW,SW |
| IV | NE,SE | center | center | center | NW,SW |
| V | NE | NW,NE | NW,NE | NW,NE | NW |

TABLE D
($Z = 2, Z = 8$)

| row | A | B | C | D | E | F |
|---|---|---|---|---|---|---|
| I | none | none | none | none | none | none |
| II | none | none | none | none | none | none |
| III | none | none | NW,SE | SW,NE | none | none |
| IV | none | none | SW,NE | NW,SE | none | none |
| V | none | none | none | none | none | none |
| VI | none | none | none | none | none | none |

TABLE E
($Z = 4, Z = 6$)

| row | A | B | C | D | E | F |
|---|---|---|---|---|---|---|
| I | none | none | none | none | none | none |
| II | none | NW,SE | NW,NE,SE | NW,NE,SW | SW,NE | none |
| III | none | NW,SW,SE | NW,SE | SW,NE | NE,SW,SE | none |
| IV | none | NW,NE,SW | NE,SW | NW,SE | NW,NE,SE | none |
| V | none | NE,SW | NE,SW,SE | NW,SW,SE | NW,SE | none |
| VI | none | none | none | none | none | none |

This placement of holes has been chosen because it allows for fluid flow from top to bottom of the phantom. The terminology convention "row" and "column" has been chosen for convenience. It has no functional significance, rows and columns being functionally equivalent.

The fluid flow diverges until it reaches the fifth layer and then converges until it reaches the bottom layer. This first diverging and then converging fluid flow is roughly analogous to the three-dimensional flow of fluids in the body. In particular, it provides a well-defined three-dimensional distribution of flow with mean value similar to that of blood bathing tissues, i.e. approximately one milliliter per 100 grams of tissue per second, and a range of flow less and greater than its mean. Fluid paths are established using holes in the tops of the blocks and the walls, fins, and center cylinders of the blocks. The above-mentioned proximity of the blocks, in their normal stacked arrangement, substantially impairs flow of fluid other than through the pathways.

The amounts of fluid traveling in the fluid pathways of phantoms of the preferred embodiment can be precisely calibrated.

Moreover, a plurality of fluids having different $T_1$ and $T_2$ relaxation times or having different spectra can be introduced into distinct entry tubes. These fluids, after a period of time of constant flow, will reach an equilibrium spatial distribution within the chambers of the phantom. This spatial distribution will be precisely predictable because of the regular structure of the phantom. The spatial distribution will be precisely measurable because of the regular three-dimensional Cartesian grid structure established by the walls of the blocks composing the phantom.

There will also be gradients of flow rates depending on the level $z=1$ through $z=9$. Given a constant flow rate through the five entry an exit tubes, there will be a lower flow rate through the larger number of holes in the middle levels. The grid structure of the phantom allows for precise measurement of spatial gradient of flow.

The equilibrium state of the phantom may be altered by changing the fluids introduced into the entry and exit tubes or by pulsing fluids through the tubes. Such pulsing would be roughly analogous to the pulsing of blood through human tissues. The regular structure of the phantom allows for precise measurement of spatial gradients of change in flow rates thus produced.

It will be readily apparent that similar diverging and converging flows could be established using other methods, for example forked tubes, machined plexiglass, or plastic. These arrangements might also require a supporting structure.

Figure 4:
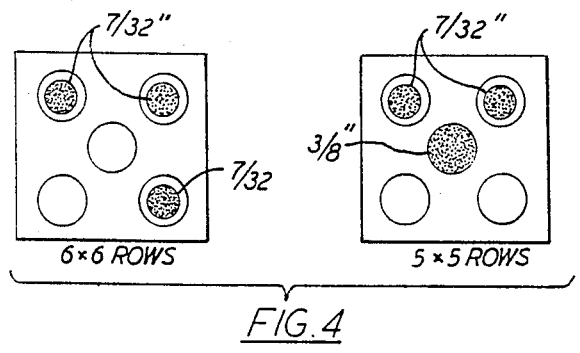
FIG. 4 shows in detail the placement of hypothetical holes in the individual structures composing the various layers of FIG. 2.

FIG. 4 shows more precisely where the preferred holes are drilled in the blocks of the various preferred rows. For instance, in the five-by-five rows ⅜" holes are drilled in the center of some of the blocks and 7/32" holes are drilled in the corners of some of the blocks. In the six-by-six rows 7/32" holes are drilled in the corners of some of the blocks. In the six-by-six rows no holes are drilled in the centers of the blocks.

Figure 6:
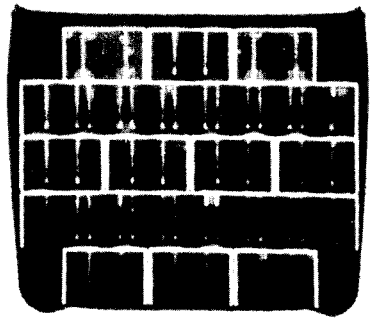
FIG. 6 is a photograph taken of an NMR image of a small embodiment of the invention using the preferred blocks immersed in a NMR signal generating solution of aqueous copper sulfate.
Figure 6:
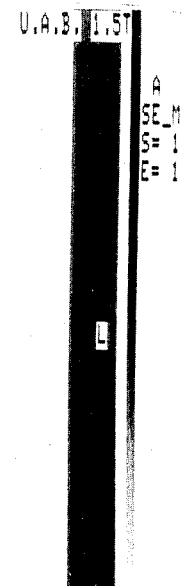

FIG. 6 is a photograph of a small embodiment similar to that schematized in FIG. 1. Dark portions correspond to air and the plastic material of the blocks. Light portions correspond to NMR signal producing fluid. A plastic container enclosing the blocks cannot be seen because it produces little signal to contrast with the surrounding air.

Figure 7A:
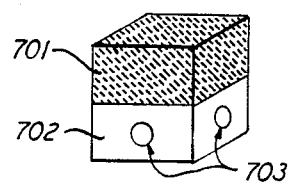
FIGS. 7a–7d are isometric views of sample subunits to be used in a modular embodiment.

FIGS. 7a–7d show various subunits of a modular embodiment of the invention. FIG. 7a shows two of the preferred blocks 701-702 stacked one on top of the other. The top block 701 is caused to adhere to the bottom block 702 forming a sealed refillable chamber. The top block 701 contains a known NMR signal-producing fluid, such as one of the solutions listed above. The volume of the top block 701 is 12.7 cm³. The blocks may be caused to adhere together by using an appropriate solvent glue which fuses them together. Holes 703 are drilled in the bottom block 702. In this way, if the subunit is submerged in an NMR signal-producing fluid, different from that contained in the top block 701, the bottom block 702 quickly fills with the submerging fluid. Block 701 and the bottom block 702, to which it is sealed by adherence, form a subunit which can easily be stacked on top of other blocks or subunits.

Figure 7B:
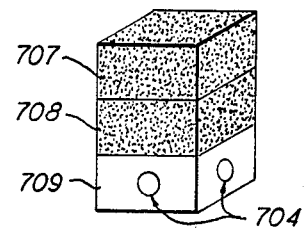

FIG. 7b shows three of the preferred blocks 707, 708, and 709, stacked one on top of another. The blocks 707, 708, and 709 are all caused to adhere to the adjacent block(s). Blocks 707 and 708 are sealed and contain NMR-signal producing fluid. The combined volume of 707 and 708 is approximately 25.3 cm³. The blocks 707 and 708 may be separately sealed and may contain distinct NMR signal-producing fluids. Alternatively, the top of block 708 may be drilled, so that blocks 707 and 708 together form two communicating chambers containing the same NMR signal-producing fluid which can be changed by means of the filling screw 817 on the top of block 707. A bottom block 709 has holes 704 drilled in it, analogously to block 702.

Figure 7C:
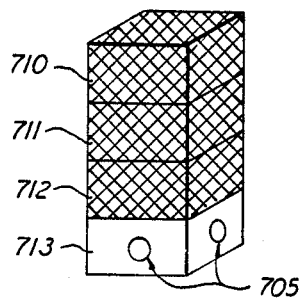

FIG. 7c shows a subunit having four of the preferred blocks 710, 711, 712 and 713 stacked one on top of another. The blocks 710, 711, 712, and 713 are all caused to adhere to adjacent blocks. Blocks 710–712 are sealed and contain NMR signal-producing fluid. The combined volumes of 710–712 is approximately 38.0 cm³. Blocks 710–712 may be separately sealed and may contain distinct NMR signal-producing fluids. Alternatively, the top of one of the block 711 or 712 may be drilled so that some combination of blocks 710–712 form communicating chambers containing the same NMR signal-producing fluid. A bottom block 713 has holes 705 drilled in it, analogously to block 702.

Figure 7D:
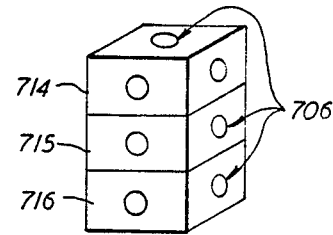

FIG. 7d shows a subunit having three of the preferred blocks 714, 715 and 716, stacked one on top of another. The blocks 714–716 are all caused to adhere to adjacent blocks. The blocks are not sealed but instead have holes drilled in them to allow an NMR signal-producing fluid in which the subunit is submersed to flow through the subunit. Some of the holes are labelled 706, others are shown as blank circles.

Other subunits, combining the preferred blocks, with the preferred blocks caused to adhere together, may be constructed using various numbers of the preferred blocks, sealed or with holes drilled in them, in various sizes and configurations. Different configurations of subunits will help to create small localized volumes of varying sorts to meet the needs of different applications.

Figure 8:
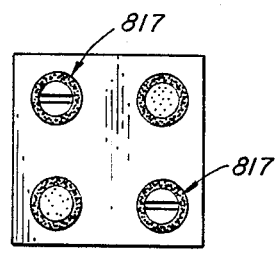
FIG. 8 is a top plan view of a sealed subunit, drilled and tapped in two opposite corners.

FIG. 8 illustrates the top of one of the subunits analogous to FIG. 7a, 7b or 7c. In other words, this is the top of a sealed subunit. Two of the four protrusions are drilled to allow insertion of NMR signal-producing fluid. Sealing screws 817 are inserted into the drilled holes to seal the NMR signal-producing fluid within the chamber so-formed and to allow for refilling with other fluids.

Figure 9:
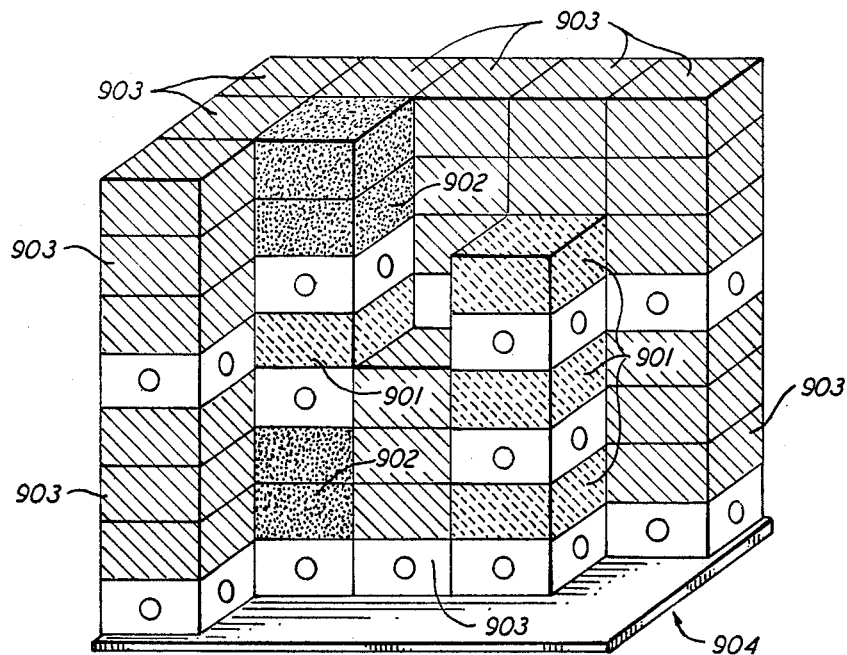
FIG. 9 is an isometric view of a phantom built from sealed subunits.

FIG. 9 is an isometric view of a phantom built from sealed subunits, as illustrated in FIG. 7a, 7b and 7c. The subunits labelled 901 are all analogous to that shown in FIG. 7a. The subunits labelled 902 are analogous to that shown in FIG. 7b. The rest of the subunits shown, such as 903 are analogous to that illustrated in FIG. 7c. The subunits are affixed to one another and to a baseplate 904. This baseplate may be of the sort commonly sold in conjunction with preferred blocks. It will be seen from FIG. 9 that the flow-through blocks, 703, 704 and 705 connected in the sealed subunits serve to separate the distinct NMR signal-producing fluids in a way which will be easily distinguished on an NMR image.

Figure 10:
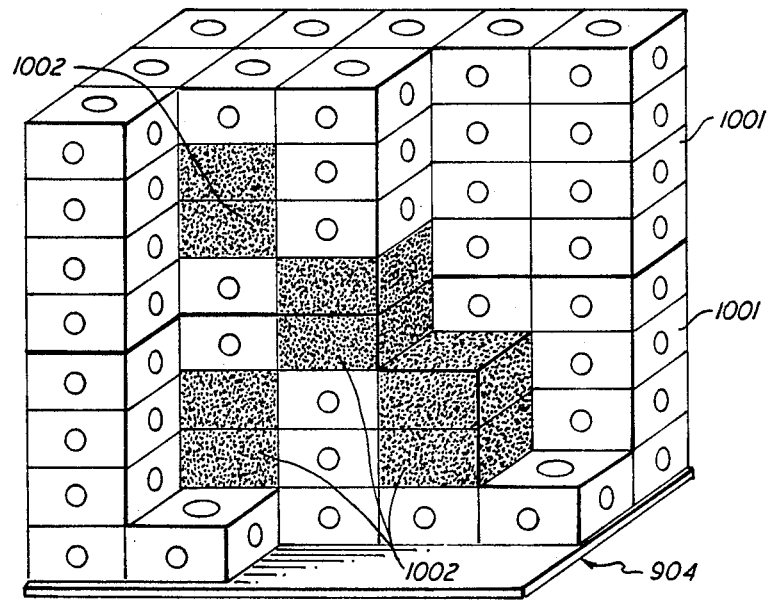
FIG. 10 is an isometric view of a phantom built from both sealed and flow-through subunits.

FIG. 10 shows another phantom constructed from subunits. In FIG. 10 most of the subunits are analogous to that of Figure D for instance the subunits at 1001 each have four of the preferred blocks with holes drilled in them. The holes are illustrated by circles. Several sealed phantoms 1002 analogous to FIG. 7b are interspersed amongst the flow-through subunits to create few small localized volumes having a distinct NMR signal producing fluid.

Both the phantoms of FIGS. 9 and 10 may be immersed in an NMR signal-producing fluid, so that the fluid enters the flow-through blocks. The phantoms of FIGS. 9 and 10 may equally be left out in the air. In this way there would be little NMR signal in the flow-through blocks and NMR signal-producing fluid in the sealed blocks. It is envisioned that subunits may be distributed to medical researchers or users of an NMR phantom, who would then assemble the sealed and flow-through subunits into phantoms of their choice. Such phantoms would be particularly useful for taking small localized spectra of diverse configurations.

I claim as my invention:

1. A precisely measurable three-dimensional Cartesian grid for calibrating an NMR imaging device, said grid including materials selected so that cross-sections of said grid provide NMR grid images defined by contrasting light and dark areas, in a plurality of planes at angles which are arbitrary with respect to one another and with respect to said grid.

2. The apparatus of claim 1 comprising:
a plurality of blocks of known sizes stacked in layers to form said three-dimensional grid; and
means for holding said blocks in said three-dimensional grid.

3. The apparatus of claim 2 wherein said blocks are substantially identical parallelepipeds with square bases.

4. The apparatus of claim 3 wherein each of said blocks defines a hollow interior for retaining a fluid.

5. The apparatus of claim 4 wherein
each of said blocks comprises a top, four walls, and a bottom, the bottoms of said blocks being open to communicate with said hollow interior, the tops of said blocks having protrusions for inserting into said bottoms so that a first block may be selectably fixed to the top of at least one second block, in a known alignment.

6. The apparatus of claim 5 wherein
said alignment comprises the walls of the first block being in planes parallel to but offset from the planes of the walls of the second block; and
said first block is fixed to the tops of at least two second blocks, said protrusions holding adjacent walls of said second blocks in such close contact that fluid flow is substantially impaired therebetween.

7. The apparatus of claim 6 wherein the tops of a subset of said blocks define holes positioned so that said holes in conjunction with said walls of said blocks form at least one path for fluid flow between the layers of said apparatus.

8. The apparatus of claim 7 comprising a plurality of said paths which diverge from a top of said apparatus toward a bottom of said apparatus.

9. The apparatus of claim 7 comprising a plurality of said paths which converge toward a bottom of said apparatus.

10. The apparatus of claim 7 comprising
a plurality of entries on at least one outside surface of said apparatus;
a plurality of said paths coupled to said entries, said paths being disposed so that distinct fluids inserted through distinct ones of said entries mix at predetermined places and in predetermined ratios inside said apparatus.

11. The apparatus of claim 4 wherein a subset of said blocks define holes which allow fluid to flow between said layers of said blocks.

12. The apparatus of claim 2 wherein said blocks are immersed in at least one fluid.

13. The apparatus of claim 12 wherein said fluid is an aqueous solution of one of: copper sulfate, $Cu^{2+}$ ions, $Cr^{3+}$ ions, $Fe^{3+}$ ions, $Mn^{2+}$ ions, and $Gd^{3+}$ ions.

14. The apparatus of claim 13 wherein the ion concentration is between $10^{-5}$ and $10^{-1}$ mol/liters.

15. The apparatus of claim 12 comprising a sealed plastic container for retaining said blocks and said fluid.

16. The apparatus of claim 2 comprising approximately 300 said blocks and wherein said three-dimensional grid is of approximately the same size as a human head.

17. The apparatus of claim 2 wherein said blocks are LEGO ® Duplo ® blocks, of dimensions approximately 2 cm × 2 cm × 1.8 cm.

18. The apparatus of claim 17 comprising
(a) five layers of twenty-five blocks, each of said five layers arranged in a square grid having five columns and five rows;
(b) four layers of thirty-six blocks, each of said four layers being arranged in a square grid having six columns and six rows;
(c) said four and five layers being stacked in an alternating arrangement so that first, third, fifth, seventh, and ninth layers are five-by-five, and second, fourth, sixth, and eighth layers are six-by-six and so that centers of said four layers are in vertical alignment with centers of said five layers;
(d) said first and ninth layers defining holes in the centers of the tops of the following blocks:

|     | column |        |        |        |      |
| --- | ------ | ------ | ------ | ------ | ---- |
| row | A      | B      | C      | D      | E    |
| I   | none   | none   | none   | none   | none |
| II  | none   | center | none   | center | none |
| III | none   | none   | center | none   | none |
| IV  | none   | center | none   | center | none |
| V   | none   | none   | none   | none   | none |

(e) said third and seventh layers defining holes in the center of the tops of the following blocks:

|     | column |        |        |        |      |
| --- | ------ | ------ | ------ | ------ | ---- |
| row | A      | B      | C      | D      | E    |
| I   | none   | none   | none   | none   | none |
| II  | none   | center | center | center | none |
| III | none   | center | center | center | none |
| IV  | none   | center | center | center | none |
| V   | none   | none   | none   | none   | none |

(f) said second and eighth layers defining holes in the top of the following positions of the following blocks:

(g) said fifth layer defining holes in the following positions of the following blocks:

| row | column A | B | C | D | E | F |
|---|---|---|---|---|---|---|
| I | none | none | none | none | none | none |
| II | none | none | none | none | none | none |
| III | none | none | NW,SE | SW,NE | none | none |
| IV | none | none | SW,NE | NW,SE | none | none |
| V | none | none | none | none | none | none |
| VI | none | none | none | none | none | none |

(g) said fifth layer defining holes in the following positions of the following blocks:

| row | column A | B | C | D | E |
|---|---|---|---|---|---|
| I | SE | SW,SE | SW,SE | SW,SE | SW |
| II | NE,SE | center | center | center | NW,SW |
| III | NE,SE | center | center | center | NW,SW |
| IV | NE,SE | center | center | center | NW,SW |
| V | NE | NW,NE | NW,NE | NW,NE | NW |

(h) said fourth and sixth layers defining holes in the following positions of the following blocks:

| row | column A | B | C | D | E | F |
|---|---|---|---|---|---|---|
| I | none | none | none | none | none | none |
| II | none | NW,SE | NW,NE SE | NW,NE SW | SW,NE | none |
| III | none | NW,SW SE | NW,SE | SW,NE | NE,SW SE | none |
| IV | none | NW,NE SW | NE,SW | NW,SE | NW,NE SE | none |
| V | none | NE,SW | NE,SW SE | NW,SW SE | NW,SE | none |
| VI | none | none | none | none | none | none |

(i) an aqueous copper sulfate solution in which said blocks are immersed;

(j) a sealed container of internal dimensions approximately 19.7 cm×19.7 cm×19.7 cm retaining said solution and said blocks; and (k) five closable tubes inserted into said holes in said first and ninth layers, whereby fluids may be injected into and drained from said apparatus along a plurality of paths defined by all of said holes and said walls of said blocks, said paths diverging from a top face of said apparatus and converging to a bottom face of said apparatus.

19. The apparatus of claim 1, wherein the apparatus defines a coordinate system and comprises at least one subunit selectably positioned, in a non-redundant manner, with respect to the coordinate system.

20. The apparatus of claim 19 wherein said at least one subunit comprises at least one block of known size.

21. The apparatus of claim 20 wherein said at least one block is selectably attachable to a plurality of precisely defined positions on a baseplate.

22. The apparatus of claim 20 comprising at least one second subunit comprising at least one second block of known size which is selectably attachable to said at least one subunit.

23. The apparatus of claim 22 wherein said at least two subunits are hollow and sealed and contain respective distinct NMR signal-producing fluids having respective distinct NMR measurable properties, whereby small localized volumes having said respective distinct NMR measurable properties are created.

24. The apparatus of claim 23 wherein said respective distinct NMR measurable properties are respective distinct $T_1$ and $T_2$ relaxation times.

25. The apparatus of claim 23 wherein said respective distinct NMR measurable properties are respective distinct NMR spectra.

26. The apparatus of claim 20 wherein said at least one block is hollow and sealed and contains an NMR signal-producing fluid.

27. The apparatus of claim 24 comprising means for removing and replacing said NMR signal-producing fluid, so that said at least one block is sealed after said NMR signal-producing fluid is replaced.

28. The apparatus of claim 20 wherein said at least one block is hollow and defines at least one external hole, whereby an NMR signal-producing fluid is selectably introduced into said at least one block through said at least one hole.

29. The apparatus of claim 19 wherein said at least one subunit comprises at least two substantially identical blocks, stacked with one on top of the other.

30. The apparatus of claim 29 wherein said at least two identical blocks are hollow, one of said at least two blocks being sealed and containing an NMR signal-producing fluid, and another of said at least two blocks defining at least one external hole, whereby said other block is made flow-through to an NMR signal-producing fluid.

31. The apparatus of claim 19 wherein said at least one subunit comprises a plurality of substantially identical blocks, said blocks being hollow and sealed, at least two of said blocks containing respective distinct NMR signal-producing fluids having respective distinct NMR measurable properties.

32. The apparatus of claim 19 wherein said at least one subunit comprises a plurality of substantially identical blocks, said blocks being hollow and sealed, and intercommunicating internally to form intercommunicating chambers.

33. A method of calibrating an NMR imaging device comprising:
imaging a three-dimensional phantom along at least one cross-sectional plane, said phantom including a plurality of substantially identical blocks of known sizes stacked in layers to form a three-dimensional grid, said blocks being immersed in a first fluid, said blocks and said first fluid being retained in a sealed container.

34. The method of claim 33 comprising:
introducing at least one second fluid into at least one entry in a first face of an outside of said phantom, said entry communicating with at least one fluid pathway inside said phantom;
draining said at least one second fluid from at least one exit in a second face of said outside of said phantom, said exit communicating with said pathway;
second imaging said three-dimensional grid at said planes at at least one subsequent time, whereby a profile of fluid flow through said phantom is obtained.

35. The method of claim 34 comprising pumping said second fluid through said phantom.

36. The method of claim 34 comprising introducing said second fluid, said second and said first fluids being the same.

37. The method of claim 34 comprising introducing at least two distinct said second fluids into said entries.

38. The method of claim 37 comprising:
taking a plurality of images during a time when said second fluids are moving through said phantom; and
measuring a gradation of T1 and T2 using said plurality of images.

39. The method of claim 37 comprising
taking a plurality of images during a time when said second fluids are moving through said phantom, and
measuring spectra at a plurality of locations in a plurality of planes in order to obtain a gradation of regional spectroscopy.

40. The method of claim 34 comprising measuring a spatial gradation of fluid from images produced in the imaging steps.

41. The method of claim 34 comprising measuring a spatial gradation of fluid flow from images produced in the imaging steps.

42. The method of claim 34 comprising measuring a spatial gradation of change in fluid flow from images produced in the imaging steps.

* * * * *